US005164628A

United States Patent [19]

Egara et al.

[11] Patent Number: 5,164,628

[45] Date of Patent: Nov. 17, 1992

[54] ELASTIC SURFACE WAVE CONVOLVA HAVING WAVE WIDTH CONVERTING MEANS AND COMMUNICATION SYSTEM USING SAME

[75] Inventors: Koichi Egara, Tokyo; Norihiro Mochizuki, Yokohama, both of Japan

[73] Assignee: Canon Kabushiki Kaisha, Tokyo, Japan

[21] Appl. No.: 702,390

[22] Filed: May 20, 1991

[30] Foreign Application Priority Data

May 21, 1990 [JP] Japan .................................. 2-129302
May 21, 1990 [JP] Japan .................................. 2-129303
May 28, 1990 [JP] Japan .................................. 2-135421

[51] Int. Cl.[5] .............................................. H01L 41/08

[52] U.S. Cl. .................................. 310/313 D; 364/821

[58] Field of Search ................... 310/313 D; 333/153, 333/195; 364/821

[56] References Cited

U.S. PATENT DOCUMENTS

| | | | |
|---|---|---|---|
| 4,038,614 | 7/1977 | Chapman et al. | 333/95 |
| 4,079,342 | 3/1978 | Solie | 333/72 |
| 4,181,904 | 1/1980 | Weller et al. | 333/153 |
| 4,428,062 | 1/1984 | Michaels | 364/821 |
| 4,556,949 | 12/1985 | Solie | 364/821 |
| 4,875,221 | 10/1989 | Mori | 375/1 |
| 4,882,715 | 11/1989 | Egara et al. | 367/140 |
| 4,965,480 | 10/1990 | Mochuzuki | 310/313 D |
| 5,003,213 | 3/1991 | Mochuzuki et al. | 310/313 D |
| 5,038,362 | 8/1991 | Takeuchi | 375/1 |

OTHER PUBLICATIONS

"Radar Signal Processing by Piezoelectric Convolver", by P. Anthouard et al., Thomson, CSF, Malakoff, France, Agard Conference, Oct. 11-15, 1977, Proceedings No. 230.

Nakagawa et al., "Surface Acoustic Wave Convolver Using Multiple Wave Guide", Japanese Journal of Applied Physics Supplements, vol. 28, No. 28-2, 1989, pp. 221-223.

Planat et al., "A Finite Element Analysis of the Piezoelectric Waveguide Convolver", IEEE Transactions on Soncis and Ultrasonics, vol. Su-32, No. 3, May 1985, pp. 928-439.

Roy, "A Rayleigh Wave Beam Compressor Using AV/V-Type Guidance", IEEE Transactions on Sobncis and Ultrasonics., vol. Su-23, No. 4, Jul. 1976, pp. 276-279.

Nakagawa, et al., "Surface Acoustic Wave Convolver Using Multiple Wave Guide", Electronics and Communications in Japan, vol. 70-2, No. 1, 1987, pp. 66-75.

"Surface Acoustic Wave Convolver Using Multiple Waveguide", by Y. Nakagawa et al., Electronic Communications Society Journal, vol. J69-C, No. 2, pp. 190-198 (1986).

"A Rayleigh Wave Beam Compressor Using Δ V/V--Type Guidance", by M. K. Roy, IEEE Transactions on Sonics and Ultrasonics, vol. SU-23, No. 4, Jul. 1976, pp. 276-379.

"Nonsymmetrical Multistrip Coupler as a Surface-Wave Beam Compressor of Large Bandwidth", by C. Maerfeld et al., Electronic Letters, vol. 9, No. 18, Sep. 6, 1973, pp. 432-434.

*Primary Examiner*—Mark O. Budd
*Assistant Examiner*—Thomas M. Dougherty
*Attorney, Agent, or Firm*—Fitzpatrick, Cella, Harper & Scinto

[57] ABSTRACT

An elastic surface wave convolve comprises a piezoelectric substrate, a plurality of input transducers formed on said substrate for generating elastic surface waves corresponding to respective input signals, a plurality of waveguides provided side by side on a region of the substrate where elastic surface waves radiated from the input transducers overlap, wherein a convolution signal of input signals is produced due to parametric mixing effect of elastic surface waves in respective waveguides, these waveguides generating an elastic surface wave corresponding to the convolution signal, and an output transducer for receiving the elastic surface wave radiated from the waveguides and taking out an electrical signal by conversion of the convolution signal, wherein the width of elastic surface wave radiated from the waveguides is narrower immediately before reception with the output transducer than immediately after radiation from the waveguides.

32 Claims, 12 Drawing Sheets

ELASTIC SURFACE WAVE CONVOLVA HAVING WAVE WIDTH CONVERTING MEANS AND COMMUNICATION SYSTEM USING SAME

BACKGROUND OF THE INVENTION

1. Field of the Invention

The present invention relates to a surface acoustic wave convolver and a communication system using it wherein an convolution output is obtained by the use of non-linear interaction of a plurality of elastic surface waves.

2. Related Background Art

An elastic surface wave convolva has been recently noted for its importance as a key device in making the spread spectrum communication. Also, many applications as a real-time signal processing device has been considered and studied actively.

FIG. 1 is a schematic plan view showing an example of such a conventional elastic surface wave convolva.

In the same figure, a piezoelectric substrate 1 is provided with a pair of input interdigital transducers 2 and a central electrode 3 therebetween. The transducers 2 are electrodes for exciting a surface acoustic wave signal, while the central electrode 3 is an electrode for propagating the surface acoustic wave signal in opposite directions to each other and for taking out an output signal.

If a signal F(t)exp(jωt) is applied to one of the transducers 2, and a signal G(t)exp(jωt) to the other, two surface acoustic waves in opposite directions to each other $$F(t-x/v)\exp[j\omega(t-x/v)] \quad (1a)$$

and $$G(t-(L-x)/v)\exp[j\omega(t-L-x)/v)] \quad (1b)$$

will propagate on a surface of the piezoelectric substrate 1. Where v is the velocity of surface acoustic wave and L is the length of central electrode 3.

On this propagation path, a product component of above surface acoustic waves is produced due to nonlinear effect, and integrated over a range of the central electrode 3 so as to be taken out. This output signal H(t) is represented by the following expression.

$$H(t) = \alpha \cdot \exp(j2\omega t)\int_{O}^{L} F(t - x/v)G(t - (L - x)/v)dx \quad (2)$$

Where α is a proportional constant.

Thus, a convolution signal of two signals F(t) and G(t) can be obtained from the central electrode 3.

However, with such a constitution, as the efficiency is generally insufficient, as shown in FIG. 2 has been proposed by Nakagawa et al, in "Electronic Communications society journal" 1986/2, Vol. j69-C, No. 2, pp190–198. Note that the axis of coordinate y as shown in FIG. 2 was appended for convenience, not meaning the crystal axis of substrate.

In FIG. 2, 11 is a piezoelectric substrate, and 12, 13 are two input interdigital transducers for excitation of surface acoustic wave formed on the substrate 1, opposed to each other and spaced by an appropriate distance in the x direction. 14-1, 14-2, . . . , **14-*n* are waveguides formed on the substrate 11 extending in parallel in the x direction between the transducers 12, 13. And 15 is an output interdigital transducer formed on a surface of the substrate 11**, spaced by an appropriate distance in the y direction from the above-mentioned waveguide.

In this elastic surface was convolva, if an electrical signal with an angular frequency ω is input to the transducers 12, 13 for excitation of surface acoustic wave, the surface acoustic wave of that frequency is excited, and propagates on the waveguides 14-1, 14-2, . . . , **14-*n* in the x direction but in opposite directions to each other, in which the elastic surface wave with an angular frequency 2ω propagating in the y direction may occur on the waveguides due to parametric mixing phenomenon. This elastic surface wave arrives at the output transducer 15** in which a convolution electrical signal for two input signals as above indicated can be obtained.

However, in the elastic surface wave convolva as shown in FIG. 2, if the interaction length (integral time) of signals is desired to be longer, the length of the waveguides **14-1–14-*n*** must be increased. As the length of the output transducer is equal to that of the waveguides, the output transducer must be also lengthened naturally when the interaction length is increased.

Since the width of electrode digit for the output transducer can be determined by the frequency of convolution signal and the propagation velocity of elastic surface wave on the substrate, the line width becomes thinner if the input center frequency becomes higher.

For example, in a split waveguide convolva using a 128° Y-X $LiNbO_3$ monocrystal as the substrate, with an input center frequency of 200 MHz and an interaction length of 6 μs, an electrode digit for output transducer has a line width of 2 μm and a length of 20 mm.

There was a problem that the resistance of electrode digit for this transducer is about 2 kΩ per line, whereby the convolution efficiency is reduced due to the resistance of this electrode digit.

Also, since the conventional output interdigital transducer as above described has a thin width of electrode digit of several μm, while the length is as long as several mm to several tens mm, there was a problem that the fabrication was difficult and the yield was bad.

SUMMARY OF THE INVENTION

An object of the present invention is to resolve the above conventional technical problems and to provide a surface acoustic wave convolver and a communication system using it, wherein high convolution efficiency is obtained and better yield on fabrication is provided.

In order to accomplish the above object of the present invention, there is provided a surface acoustic wave convolver comprising, a piezoelectric substrate, a plurality of input transducers formed on said substrate for generating surface acoustic wave corresponding to respective input signals, a plurality of waveguides provided side by side on a region of the substrate where the surface acoustic waves radiated from the input transducers overlap, wherein a convolution signal of input signals is produced due to parametric mixing effect of elastic surface waves in respective waveguides, these waveguides generating an surface acoustic waves corresponding to said convolution signal; and an output transducer for receiving the surface acoustic waves radiated from the waveguides and taking out an electrical signal by conversion from said convolution signal, wherein the width of the surface acoustic wave radiated from the waveguides is narrower immediately before reception with said output transducer than immediately after radiation from the waveguides.

In order to change the width of the surface acoustic wave radiated from the waveguides as above described, in an embodiment of the present invention, there is provided means for reducing the width of surface acoustic wave in a propagation path for elastic surface wave leading from the waveguides to the output transducer. As this reducing means, a hone-type waveguide or multistrip coupler is used.

In another embodiment of the present invention, in order to change the width of the surface acoustic wave; a plurality of waveguides are formed in a circular arc shape substantially concentric so as to converge the surface acoustic wave radiated from these waveguides.

That is, according to the present invention, as the width of elastic surface wave radiated from the waveguides is reduced for reception by the output transducer, the length of the output transducer can be made shorter. And thus, the convolution efficiency can be improved by decreasing the resistance of electrode digit for the output transducer. Also, the yield on fabrication of the output transducer is improved.

Also, there is provided a communication system using the above surface acoustic wave convolver comprising, (a) a transmitter for transmitting a signal modulated depending on the information, (b) a circuit for receiving the modulated signal transmitted from the transmitter, (c) a circuit for generating a reference signal, (d) an surface acoustic wave convolver outputting a convolution signal of said received signal and said reference signal, and (e) a circuit for demodulating said information using said convolution signal, wherein the surface acoustic wave convolver is constituted of a piezoelectric substrate, a first input transducer formed on said substrate for generating an surface acoustic wave corresponding to the input signal received by the reception circuit, a second input transducer formed on said substrate for generating an surface acoustic wave corresponding to said reference signal, a plurality of waveguides provided side by side on a region of said substrate where surface acoustic waves radiated from the first and second input transducers overlap, wherein a convolution signal of the input signals is produced due to parametric mixing effect of surface acoustic waves in respective waveguides, those waveguides generating an surface acoustic wave corresponding to the convolution signal, and an output transducer for receiving the elastic surface wave radiated from the waveguides and taking out an electrical signal by conversion from the convolution signal, wherein the width of the surface acoustic wave radiated from the waveguides is narrower immediately before reception with the output transducer than immediately after radiation from the waveguides.

DETAILED DESCRIPTION OF THE PREFERRED EMBODIMENTS

Figure 1:
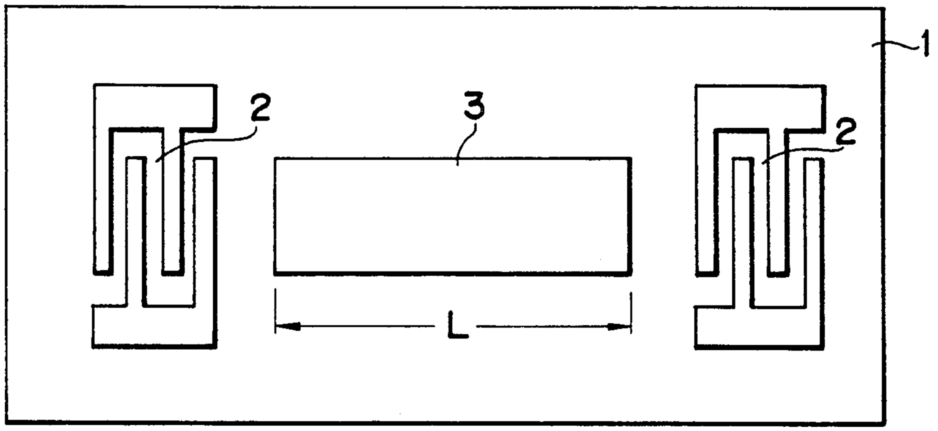
F I G . 1 PRIOR ART
FIGS. 1 and 2 are schematic views showing conventional surface acoustic wave convolvers, respectively.
Figure 2:
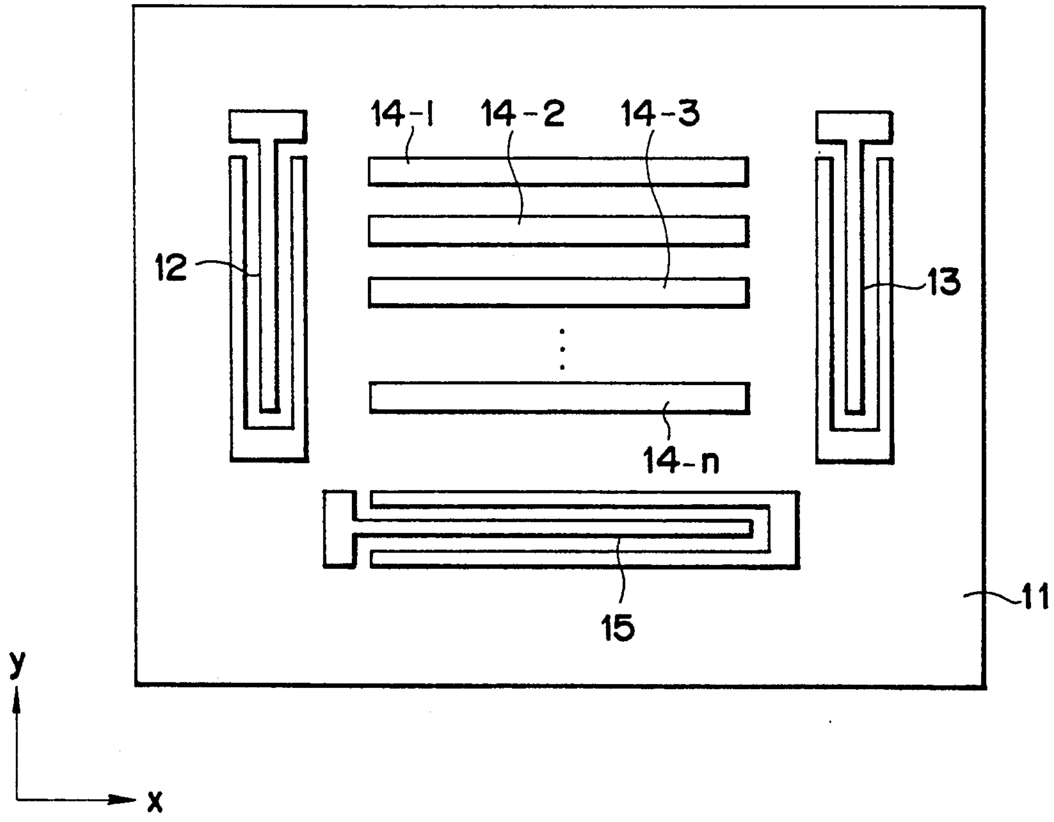
F I G . 2 PRIOR ART
Figure 3:
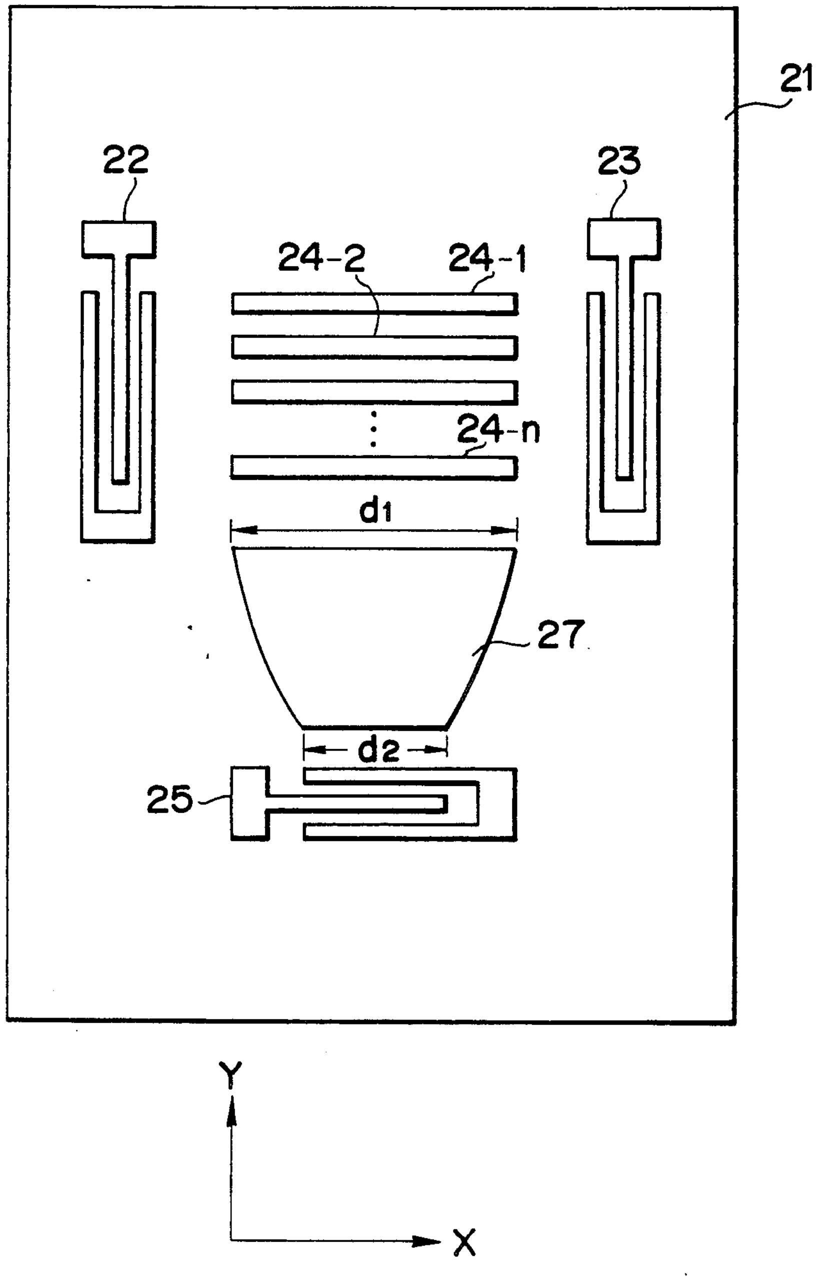
FIGS. 3 to 8 are schematic views showing first to sixth examples of surface acoustic wave convolvers according to the present invention, respectively.

FIG. 3 is a schematic plan view showing a first example of an surface acoustic wave convolver according to the present invention.

Note that the axis of coordinate in the figure is appended for convenience, not meaning a crystal axis of substrate. In FIG. 3, 21 is a piezoelectric substrate, which is made of lithium niobate, for example.

22, 23 are input interdigital transducers, for excitation of surface acoustic wave formed on a surface of the substrate 21, opposed to each other and spaced by an appropriate distance in the x direction. The transducers 22, 23 are comb-type electrodes, made of an electric conductor such as aluminum, silver, gold, etc. Also, the transducers are provided in such a way that the elastic surface wave can propagate in ± x direction.

24-1, 24-2, . . . , **24-*n* are waveguides formed on a surface of the substrate 21, extending in the x direction between the transducers 22, 23** and in parallel to each other and arranged at a fixed pitch.

These waveguides are described in detail in "Elastic surface wave engineering" supervised by Mikio Shibayama, Electronic communications society, pp.82 to 102, in which there are kinds of thin film waveguide and topographic waveguide. In the present invention, Δv/v waveguide, whose substrate surface is covered with an electric conductor such as aluminum, silver, gold, etc. is preferable.

25 is an output interdigital transducer formed on the surface of the substrate 21 and spaced by an appropriate distance in the y direction from the above waveguides 24-1 to **24-*n*. The transducer 25 consists of a comb-type electrode made of an electric conductor such as aluminum, silver, gold, etc. Also, the transducer 25** is provided so as to convert elastic surface wave propagating in the y direction to an electrical signal efficiency.

27 is a hone-type waveguide formed on the surface of the substrate 21 and arranged between the above output transducer 25 and the above waveguide **24-*n***

The hone-type waveguide is described in detail by MANAS K. ROY in "Wave Beam Compressor Using Δv/v-Type Guidance" IEEE Trans. on Sonics and Ultrasonics, Vo. Su-23, July 1976, pp.276 to 279.

The hone-type waveguide includes thin-film waveguide and topographic waveguide, but in the present invention, Δv/v waveguide is preferable in which a surface of waveguide is covered with an electric conductor such as aluminum, silver, gold. etc.

In the elastic surface convolva of this example, if an electrical signal with a central angular frequency ω is input to one input transducer 22, an elastic surface wave is excited from the transducer 22 to enter the waveguides 24-1 to **24-*n*. Also, in the same way, if an electrical signal with a central angular frequency ω is input to the other input transducer 23, an elastic surface wave is excited from the transducer 23 to enter the waveguides 24-1 to 24-*n*.**

The elastic surface waves excited by the transducers 22, 23 respectively and propagating in opposite directions to each other from both ends of the waveguides 24-1 to **24-*n* give rise to non-linear interaction on the waveguides 24-1 to 24-*n* due to parametric mixing phenomenon. And they produce an elastic surface wave with a central angular frequency 2 $\omega$ propagating in $\pm$ y directions on both sides thereof. Hereby, the beam width $d_1$ of this elastic surface wave is equal to the length of each waveguide 24-1 to 24-*n*. Also, this elastic surface wave corresponds to a convolution signal of signals input to the transducers 22, 23**, respectively.

And this elastic surface wave enters the hone-type waveguide 27 with a beam width $d_1$ to propagate reflected at a boundary of the hone-type waveguide 27 and emerge therefrom with a beam width $d_2$, and enters the output transducer 25. Thereby, a convolution signal of two signals input from the transducers 22, 23 can be obtained.

Hereby, by forming and arranging the hone-type waveguide so that the angle of incidence $\theta$ as the elastic surface wave is reflected at a boundary of the hone-type waveguide can satisfy $\sin \theta > v_1/v_0$ ($v_1$ is a velocity of elastic surface wave on the surface of hone-type waveguide, and $v_0$ is a velocity of elastic surface wave on the free surface), the elastic surface wave is totally reflected without leaking out of the hone-type waveguide, whereby the beam width of elastic surface wave can be efficiently converted.

Accordingly, the beam width of elastic surface wave produced by the split waveguides 24-1 to **24-*n* is reduced from $d_1$ to $d_2$ by the hone-type waveguide 27**, so that the length of output comb-type electrode can be made $d_2$.

Figure 4:
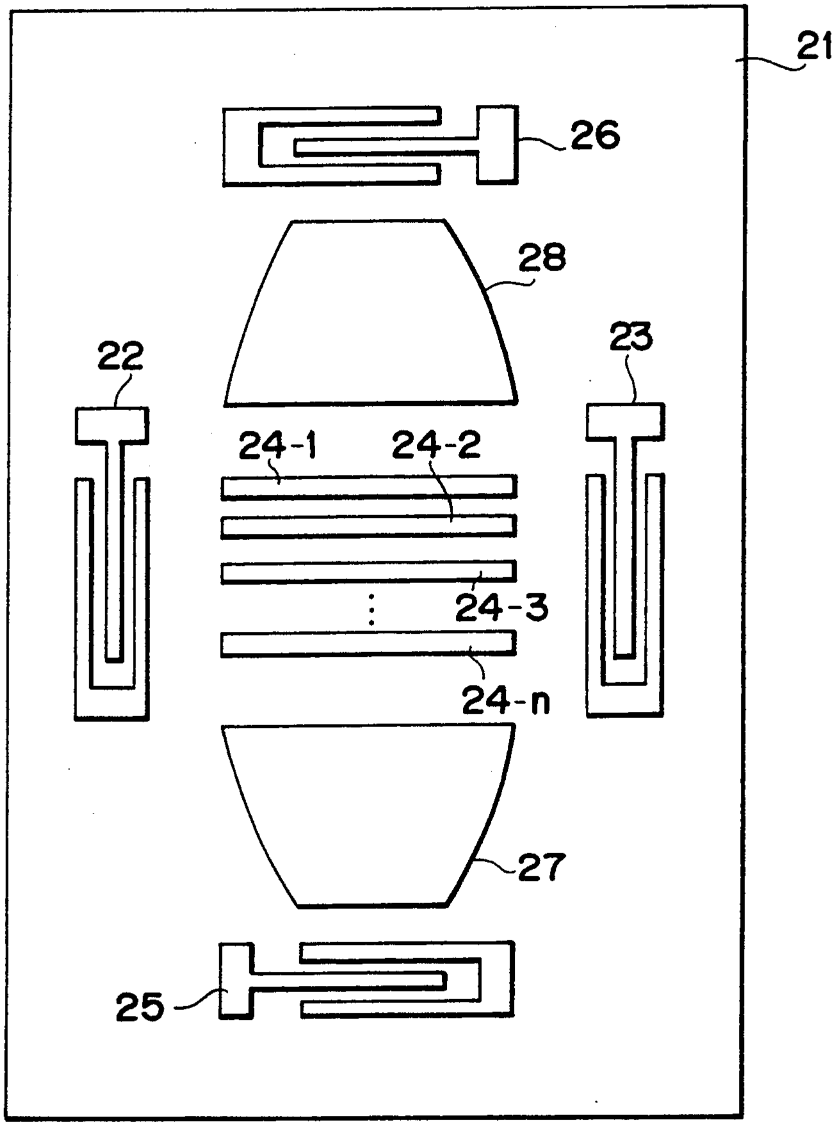

FIG. 4 is a schematic view showing a second example of an elastic surface wave convolva according to the present invention. In FIG. 4, same numerals are attached to same parts as shown in FIG. 3, and detail explanation will be omitted.

In this example, hone-type waveguides 27, 28 and output transducers 25, 26 are formed on both sides of respective waveguides 24-1 to **24-*n*** and arranged in symmetry.

Also, in this example, the same action effect as that in the first example can be obtained, but further in this example, as elastic surface waves produced on the waveguides may propagate in both $\pm$ y directions, the output twice that of the first example can be obtained by synthesizing the outputs from two transducers 25, 26.

It is note that by having different distances of two output transducers 25, 26 from the waveguides 24-1 to **24-*n*,** the output from one output transducer can be delayed by appropriate time from that of the other output transducer.

Figure 5:
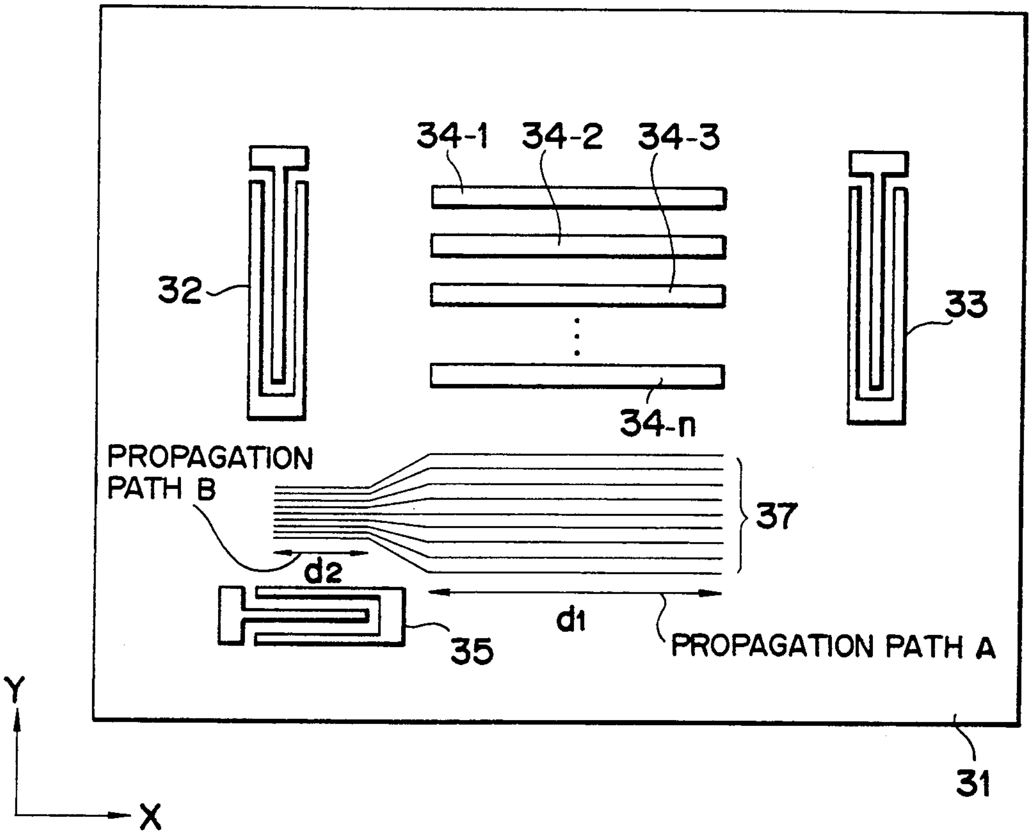

FIG. 5 is a schematic plan view showing a third example of an elastic surface wave convolva according to the present invention.

Note that the axis of coordinate in the figure is appended for convenience, not meaning a crystal axis of substrate.

In FIG. 5, 31 is a piezoelectric substrate, which is made of for example lithium niobate.

32, 33 are input interdigital transducers for excitation of elastic surface wave formed on a surface of the substrate 31, opposed to each other and spaced by an appropriate distance in the x direction. These transducers 32, 33 are comb-type electrodes, made of an electric conductor such as aluminum, silver, gold, etc. Also, these transducers are provided in such a way that the elastic surface wave can propagate in $\pm$ x directions.

34-1, 34-2, . . . , **34-*n* are waveguides formed on the surface of the substrate 31, extending in the x direction between the transducers 32, 33** and in parallel to each other and arranged at a fixed pitch. The waveguides used are the same as those in the first example.

35 is an output interdigital transducer formed on the surface of the substrate 31, like in the first example.

37 is a multistrip coupler formed on the surface of the substrate 31 and arranged between the transducer 35 and the waveguide **34-*n*.** The multistrip coupler is made of an electric conductor such as aluminum, silver, gold, etc., for example. And by appropriately selecting the number and pitch of strips constituting the multistrip coupler, the elastic surface wave propagating on propagation path A can be transferred to propagation path B efficiently.

As to the multistrip coupler, refer to "Nonsymmetrical multistrip coupler as a surface-wave beam compressor of large bandwidth" Electron. lett, by C. Maerfeld, G. W. Farnell.

In this example, an elastic surface wave with a beam width $d_1$ radiated from the waveguides 34-1 to **34-*n* enters the multistrip coupler 37 in the same process as in the first example. In the multistrip coupler 37, the elastic surface wave with the beam width $d_1$ entering propagation path A emerges therefrom to propagation path B, with a beam width $d_2$, and enters an output transducer 35. That is, since the beam width of elastic surface wave is narrowed from $d_1$ to $d_2$ by the multistrip coupler 37, the length of electrode for the output transducer 35 can be reduced to $d_2$ which is shorter than that of waveguide 34-1 to 34-*n*.**

Figure 6:
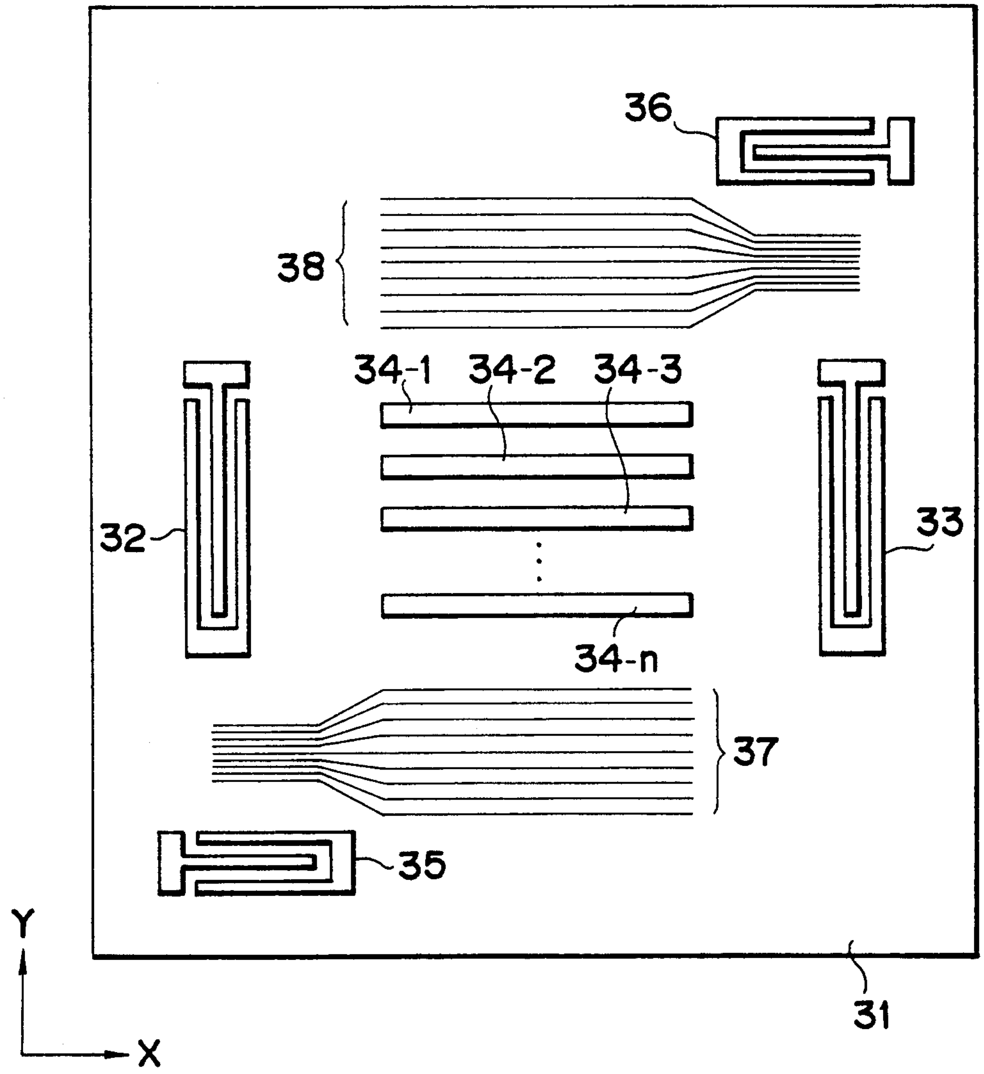

FIG. 6 is a schematic view showing a fourth example of an elastic surface wave convolva according to the present invention. In FIG. 6, same numerals are attached to same parts as shown in FIG. 5, and detail explanation will be omitted.

In this example, multistrip couplers 37, 38 and output transducers 35, 36 are formed on both sides of waveguides 34-1 to **34-*n*** and arranged in symmetry.

Also, in this example, the same action effect as that in the third example can be obtained, but further in this example, as an elastic surface wave produced on the waveguides may propagate in body $\pm$ y directions, the output twice that of the third example can be obtained by synthesizing the outputs from two output transducers 35, 36. It is note that by having different distances of two output transducers 35, 36 from the waveguides 34-1 to **34-*n*,** the output from one output transducer can be delayed by appropriate time from that of the other output transducer.

Figure 7:
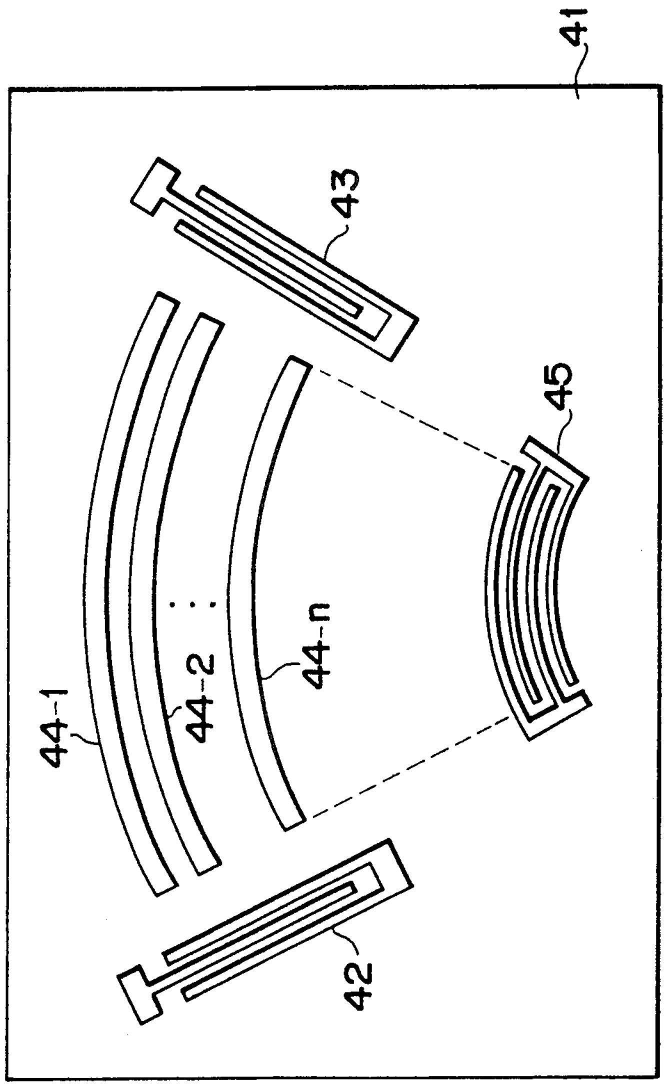

FIG. 7 is a schematic plan view showing a fifth example of an elastic surface wave convolva according to the present invention.

In FIG. 7, numeral 41 indicates a piezoelectric substrate made of the same material as that of the substrate 21 in the first example. Numerals 42 and 43 indicate input interdigital transducers formed in the same way as those in the first example. These transducers 42, 43 are provided in the orientations in which elastic surface waves excited therefrom may propagate along curved waveguides.

44-1, 44-2, . . . , **44-*n* are waveguides formed between the transducers 42, 43** and arranged in circular arc shape at a fixed pitch. Each waveguide has a same center, arranged so that elastic surface waves excited from the waveguides becomes a single converged beam. These waveguides are made of the same material as that of the waveguides in the first example, for example.

45 is an output interdigital transducer formed on a surface of the substrate 41 for converting elastic surface waves excited from the above waveguides 44-1 to **44-*n*** into an electrical signal. This transducer is a comb-type electrode, made of for example an electric conductor such as aluminum, silver, gold, etc.

The output transducer 45 is positioned near a focal point of converged beam propagating from the waveguides and formed in circular arc shape concentric with the waveguides, in order to convert the elastic surface wave which is made a converged beam into an electrical signal efficiently.

In this example, the elastic surface waves excited from the transducers 42, 43 respectively produce a convolution signal of input signals due to non-linear interaction within each waveguide, in the same process as that in the first example. And an elastic surface wave corresponding to the convolution signal is excited from these waveguides 4-1 to **44-*n***.

Hereby, since the waveguides 44-1 to **44-*n* are formed in circular arc shape, produced elastic surface waves propagate in a converged beam to arrive at the output transducer 45** arranged at or near a focal point.

The focal point of converged beam is displaced from a center of the circular arc because the substrate 41 used is anisotropic, with its position depending on the anisotropy of substrate.

By forming the output transducer 45 in circular arc shape, converged elastic surface wave beam can be efficiently converted into an electrical signal.

As above described, since the beam width of elastic surface wave entering the output transducer is converted and narrowed, the length of electrode for the output transducer 45 can be made shorter to obtain the same length of interaction, as compared with a conventional split waveguide elastic surface wave convolva.

Figure 8:
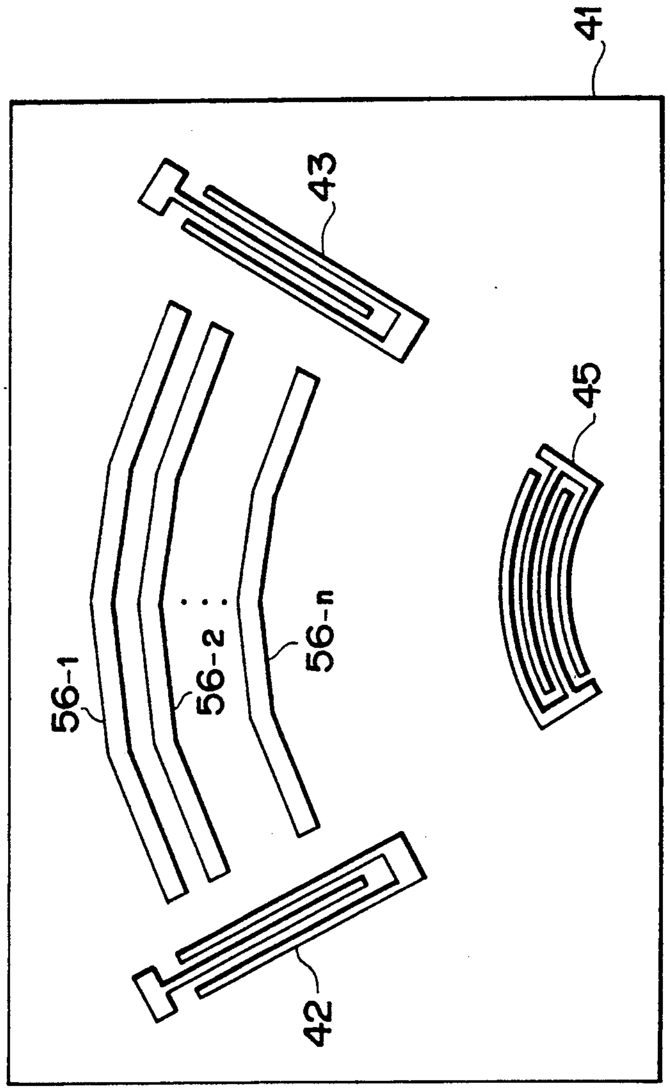

FIG. 8 is a schematic view showing a sixth example of an elastic surface wave convolva according to the present invention. In FIG. 8, same numerals are attached to same parts as shown in FIG. 7, and detail explanation will be omitted.

In this example, waveguides 56-1 to **56-*n*** are composed of a plurality of consecutive lines, respectively, and formed substantially in circular arc shape as a whole.

Also, in this example, elastic surface waves excited by the waveguides 56-1 to **56-*n*** are made a converged beam, so that the same effect as that in the fifth example can be obtained.

Also, in the fifth example as previously described, the waveguides 44-1 to **44-*n*** were of complete circular arc shape, whereas any shape for converging the beam other than a complete circular arc shape can be used to obtain the same effect as in the fifth example.

In the fifth and sixth examples, the output transducer 45 is formed in circular arc shape to convert converged elastic surface wave into an electrical signal efficiently, but when the width of converged beam is narrow, the same effect can be obtained by forming the transducer 45 in linear shape.

Figure 9:
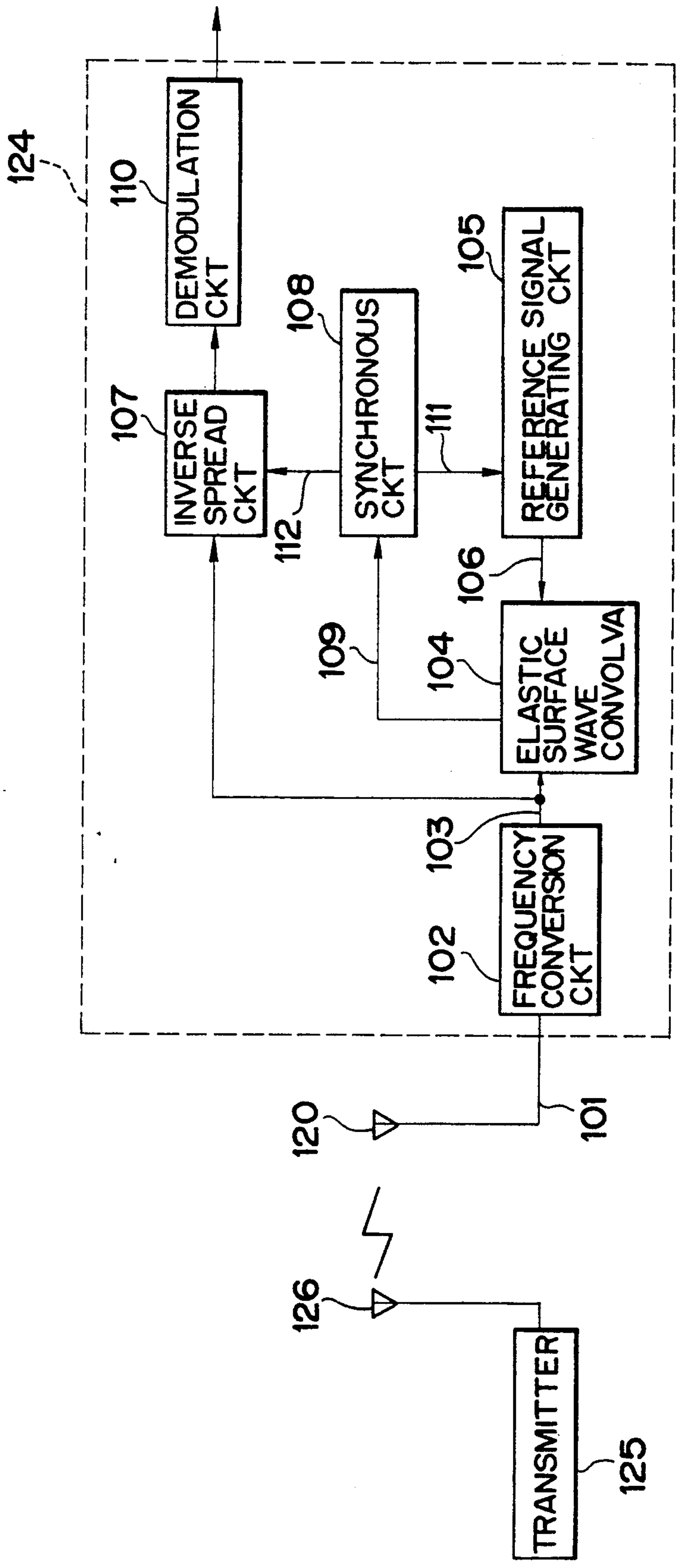
FIG. 9 is a block diagram showing an example of a communication system using an surface acoustic wave convolver according to the present invention.

FIG. 9 is a block diagram showing an example of a communication system using such an elastic surface wave convolva as above described. In FIG. 9, numeral 125 indicates a transmitter. This transmitter spreads spectrum for a signal to be transmitted from an antenna 126. Transmitted signal is received at an antenna 120 of a receiver 124, and received signal 101 is input to a frequency conversion circuit 102. IF signal 103 having its frequency converted into that conforming to an input frequency of elastic surface wave convolva in the frequency conversion circuit 102 is input to an elastic surface wave convolva 104 of the present invention as shown in FIGS. 3 to 8. Hereby, the IF signal 103 is input to one input transducer of the convolva, e.g. a transducer 22 of FIG. 3.

On the other hand, a reference signal 106 output from a reference signal generating circuit 105 is input to the other input transducer of the elastic surface wave convolva 104, e.g. a transducer 23 of FIG. 3. And in the convolva 104, the convolution (correlation) operation of the IF signal 103 and the reference signal 106 is performed as previously described, and an output signal (convolution signal) 109 is output from an output transducer, e.g., a transducer 25 of FIG. 3. This output signal 109 is input to a synchronous circuit 108. The synchronous circuit 108 produces synchronizing signals 111 and 112 from the output signal 109 of the elastic surface wave convolva 104 which are input into the reference signal generating circuit 105 and an inverse spread circuit 107, respectively. The reference signal generating circuit 105 outputs a reference signal 106 at the timing adjusted with the synchronizing signal 111. The inverse spread circuit 107 restores the IF signal 103 to a signal before spread spectrum, using the synchronizing signal 112. This signal is converted into an information signal in a demodulation circuit 110 and output.

Figure 10:
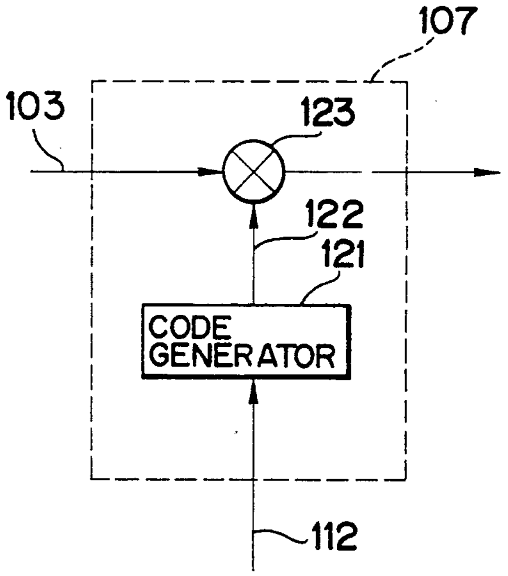
FIG. 10 is a block diagram showing a schematic constitutional example of an inverse spread circuit of FIG. 9.

FIG. 10 shows a constitutional example of inverse spread circuit 107. In FIG. 10, 121 is a code generator, and 123 is a multiplier. In the code generator 121, the synchronizing signal 112 output from the synchronous circuit 108 is input, and a code 122 having its timing adjusted with that synchronizing signal 112 is output. In the multiplier 123, the IF signal 103 and the code 122 are input, and a multiplied result of IF signal 103 and code 122 is output. If the timing at this moment between IF signal 103 and code 122 is coincident, IF signal 103 is converted into a signal before spread spectrum and output.

It is noted that when the frequency of received signal 101 is coincident with the input frequency of elastic surface wave convolva 104 the frequency conversion circuit 102 is unnecessary, in which the received signal 101 can be input through an amplifier and a filter directly into the elastic surface wave convolva 104. Also, in FIG. 9, in order to make the explanation more clearly, the amplifier and the filter are omitted, whereas the amplifier and the filter may be inserted at previous or later stage of each block as required. Moreover, while in this example, a transmission signal is received at the antenna 120, it is also possible to connect the transmitter and the receiver with a wire system such as a cable, without using the antenna 120.

Figure 11:
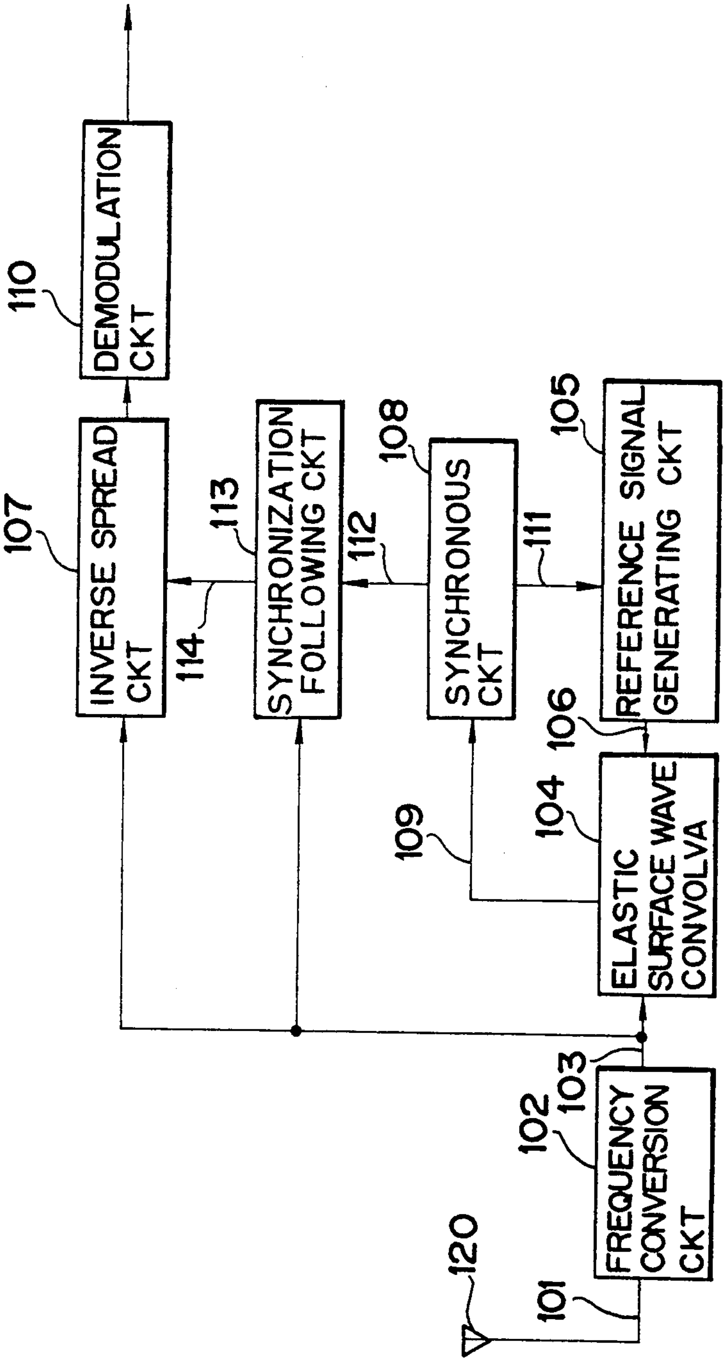
FIGS. 11 to 13 are block diagrams showing variations of the receiver as shown in FIG. 9, respectively.

FIG. 11 is a block diagram showing a first variation of receiver 124 in the communication system of FIG. 9. In FIG. 11, same numerals are appended to same parts as in FIG. 9, and detailed explanation is omitted.

In this example, a synchronous following circuit 113 is provided, in which the IF signal 103 is also input to the synchronous following circuit 113. Also, the synchronizing signal 112 output from the synchronizing circuit 108 is input to the synchronous following circuit 113, and a synchronizing signal 114 output from the synchronous following circuit 113 is input to the inverse spread circuit 117. This example is different from that of FIG. 9 in these respects. As the synchronous following circuit, there are tau dither loop circuit and delay lock loop circuit, either of which can be used.

In this example, the same action effect as that of FIG. 9 can be obtained, but further in this example, the synchronous following is performed such that after synchronization is largely achieved in a synchronous circuit 108, the synchronization is further made in the synchronous following circuit 113 to be more accurate, so that out of phase is not likely to occur and the error rate can be decreased.

Figure 12:
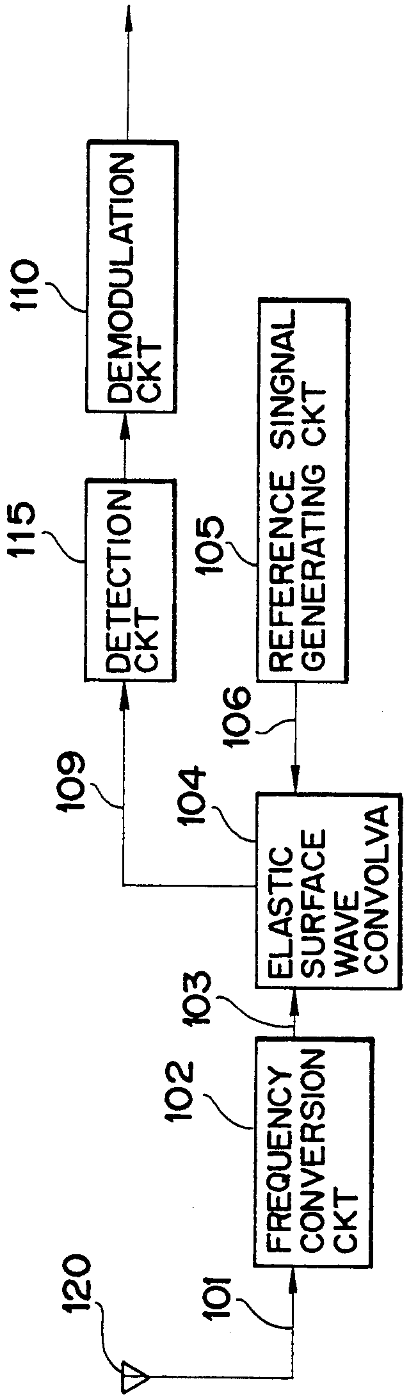

FIG. 12 is a block diagram showing a second variation of receiver 124 in the communication system of FIG. 9. In FIG. 12, same numerals are appended to same parts as in FIG. 9, and detailed explanation is omitted.

In this example, the output from the elastic surface wave convolva 101 is input to a detection circuit 115, the output of which is used for the demodulation. As the detection circuit 115, there are synchronous detection circuit, delay detection circuit or envelope detection circuit, which can be selected to use depending on the modulation method of signal.

Assuming that a received signal 101 is a signal modulated with any one of phase modulation, frequency modulation and amplitude modulation, the output 109 from the elastic surface wave convolva 104 has modulated information reflected. Particularly, if the length d of waveguide for the elastic surface wave convolva 104 satisfies $d=vT$ where the time per bit of data is T for received signal 101 and the velocity of elastic surface wave is v, modulated information appears directly on the output 109. For example, assume that a phase modulated signal $f(x)\exp(j\theta)$ is transmitted, and that signal is received as the received signal 101. In this case, if a reference signal g(t) 106 is input to elastic surface wave element 104, its output 109 becomes $$f(t)\exp(j\theta)g(\tau-t)dt=\exp(j\theta)f(t)g(\tau-t)dt \quad (3)$$

and phase modulated information appears. Therefore, the output 109 from the elastic surface wave element 104 is demodulated by passing through an appropriate detection circuit 115.

Figure 13:
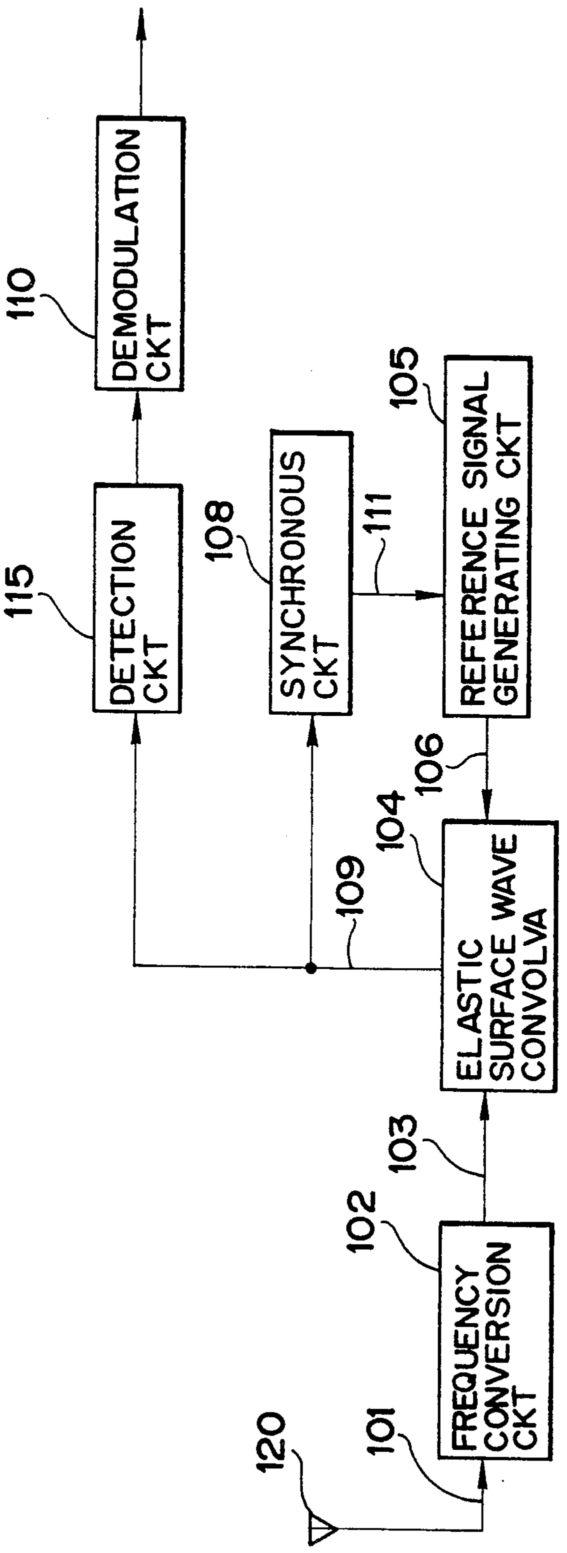

FIG. 13 is a block diagram showing a third variation of receiver 124 of FIG. 9. In FIG. 13, same numerals are appended to same parts as in FIG. 12, and detailed explanation is omitted.

In this example, a synchronous circuit 108 is provided, and the output 109 from the elastic surface wave convolva 104 is also input to the synchronous circuit 108. Also, a synchronizing signal 111 is output from the synchronous circuit 108 and input to the reference signal generating circuit 105. This example is different from that of FIG. 12 in these respects.

In this example, the same action effect as that of FIG. 12 can be obtained, but in this example, by providing the synchronous circuit 108 and controlling the reference signal generating circuit 105 with the synchronous signal 111 output from the synchronous circuit 108, the synchronization can be made more stably.

The present invention allows for various applications other than the above examples. For example, by making the input transducer in the first to sixth examples an double electrode (split electrode), the reflection of elastic surface waves against the input transducer can be suppressed.

Similarly, by making the output transducer an double electrode (split electrode), it is possible to suppress the reflection of elastic surface waves against the output, transducer, and to make the characteristics of elastic surface wave convolva more excellent. Furthermore, the substrate is not limited to a piezoelectric monocrystal such as lithium niobate, but may be a material or structure having parametric mixing effect, for example, a structure in which a piezoelectric film is added onto a semiconductor or glass substrate.

Also, it is possible to make the length of output transducer further shorter by combining a beam width compressor such as a hone-type waveguide or a multistrip coupler with the waveguides which radiate elastic surface waves to be converged as in the fifth and sixth examples.

The present invention will cover all the above application examples as may be included within the appended claims.

What is claimed is:

1. A surface acoustic wave convolver comprising:
   a piezoelectric substrate;
   a plurality of input transducers formed on said substrate for generating surface acoustic waves corresponding to respective input signals;
   a plurality of waveguides provided side by side on a region of the substrate where the surface acoustic waves radiated from the input transducers overlap, wherein a convolution signal of input signals is produced due to parametric mixing effect of surface acoustic waves in respective waveguides, these waveguides generating an surface acoustic wave corresponding to the convolution signal; and
   an output transducer for receiving the surface acoustic wave radiated from the waveguides and taking out an electric signal by conversion of the convolution signal;
   wherein the width of the surface acoustic wave radiated from the waveguides is narrower immediately before reception with the output transducer than immediately after radiation from the waveguides.

2. A surface acoustic wave convolver according to claim 1, further comprising means for reducing the width of the surface acoustic wave radiated from said waveguides provided in a propagation path for the surface acoustic wave leading from said waveguides to the output transducer.

3. A surface acoustic wave convolver according to claim 2, wherein said reducing means consists of a hone-type waveguide.

4. A surface acoustic wave convolver according to claim 2, wherein said reducing means consists of a multi-strip coupler.

5. A surface acoustic wave convolver according to claim 1, wherein said plurality of waveguides are formed in circular arc shape substantially concentric by which the surface acoustic waves radiated from said waveguides are converged.

6. A surface acoustic wave convolver according to claim 5, wherein each of said waveguides consists of a plurality of consecutive linear portions.

7. A surface acoustic wave convolver according to claim 1, wherein said waveguides radiate surface acoustic waves on both sides of disposed array, and the output transducer consists of first and second transducers each for receiving surface acoustic waves.

8. A surface acoustic wave convolver comprising:

a piezoelectric surface;

a plurality of input transducers formed on said substrate for generating surface acoustic waves according to respective input signals;

a plurality of waveguides provided side by side on a region of the substrate where surface acoustic waves radiated from the input transducers overlap, wherein a convolution signal of input signals is produced due to parametric mixing effect of surface acoustic waves in respective waveguides, these waveguides generating a surface acoustic wave corresponding to the convolution signal;

an output transducer for receiving the surface acoustic wave radiated from the waveguides and taking out an electrical signal by conversion of the convolution signal; and means for reducing the width of the surface acoustic wave radiated from said waveguides provided in a propagation path of the surface acoustic wave leading from said waveguides to the output transducer.

9. A surface acoustic wave convolver according to claim 8, wherein said reducing means consists of a hone-type waveguide.

10. A surface acoustic wave convolver according to claim 8, wherein said reducing means consists of a multistrip coupler.

11. A surface acoustic wave convolver according to claim 8, wherein said waveguides radiate surface acoustic waves on both sides of disposed array, and the output transducer consists of first and second transducers each for receiving surface acoustic waves.

12. A surface acoustic wave convolver comprising:

a piezoelectric substrate;

a plurality of input transducers formed on said substrate for generating surface acoustic waves corresponding to respective input signals;

a plurality of waveguides provided side by side on a region of the substrate where surface acoustic waves radiated from the input transducers overlap, wherein a convolution signal of input signals is produced due to parametric mixing effect of surface acoustic waves in respective waveguides, these waveguides formed in circular arc shape substantially concentric and radiating surface acoustic waves to be converted corresponding to said convolution signal; and an output transducer for receiving converged surface acoustic waves radiated from the waveguides and taking out an electrical signal by conversion of the convolution signal.

13. A surface acoustic wave convolver according to claim 12, wherein said output transducer is formed in circular arc shape substantially concentric with the waveguides.

14. A surface acoustic wave convolver according to claim 12, wherein each of said waveguides consists of a plurality of consecutive linear portions.

15. A signal receiver comprising:

(a) a circuit for receiving a signal transmitted from a transmitter;

(b) a surface acoustic wave convolver for convolving said received signal with a reference signal and outputting a convolution signal corresponding to the convolution of said received signal and said reference signal; and (c) a circuit for demodulating aid received signal using said convolution signal;

wherein said surface acoustic wave convolver is constituted of:

a piezoelectric substrate;

a first input transducer formed on said substrate for generating a surface acoustic wave corresponding to the signal received by reception circuit;

a second input transducer formed on said substrate for generating surface acoustic wave corresponding to the reference signal;

a plurality of waveguides provided side by side on a region of the substrate where surface acoustic waves radiated from the first and second input transducers overlap, wherein a convolution signal of input signals is produced due to parametric mixing effect of surface acoustic waves in respective waveguides, these waveguides radiating a surface acoustic wave corresponding to said convolution signal; and an output transducer for receiving the surface acoustic wave radiated from the waveguides and taking out an electrical signal by conversion of the convolution signal, wherein the width of the surface acoustic wave radiated from the waveguides is narrower immediately before reception by the output transducer than immediately after radiation from the waveguides.

16. A surface acoustic wave convolver according to claim 15, further comprising means for reducing the width of the surface acoustic wave radiated from the waveguides provided in a propagation path for the surface acoustic wave leading from the waveguides to the output transducer.

17. A surface acoustic wave convolver according to claim 16, wherein the reducing means consists of a hone-type waveguide.

18. A surface acoustic wave convolver according to claim 16, wherein said reducing means consists of a multi-strip coupler.

19. A surface acoustic wave convolver according to claim 15, wherein said plurality of waveguides are formed in a circular arc shape substantially concentric by which surface acoustic waves radiated from said waveguides are converged.

20. A surface acoustic wave guide convolver according to claim 19, wherein each of said waveguides consists of a plurality of consecutive linear portions.

21. A surface acoustic wave convolver according to claim 21, further comprising a detection circuit in which a convolution signal taken out from said output transducer is input and from which a detected signal is output to a demodulation circuit.

22. A signal receiver according to claim 21, wherein the surface acoustic wave convolver further comprises a synchronizing circuit responsive to the convolution signal for producing a synchronizing signal and outputting the synchronizing signal to a reference signal generating circuit.

23. A signal receiver according to claim 15, wherein said signal transmitted from said transmitter is a spread spectrum signal, and further comprises a synchronizing circuit for producing a synchronizing signal from the convolution signal, and an inverse spread circuit for removing the spread spectrum from the received signal and the synchronizing signal and for outputting the spread spectrum removed received signal to the demodulating circuit.

24. A communication system comprising:

(a) a transmitter for transmitting a signal modulated by information;

(b) a circuit for receiving the modulated signal transmitted from said transmitter;

(c) surface acoustic wave convolver for convolving said received signal with a reference signal and outputting a convolution signal corresponding to the convolution of said received signal and said reference signal; and (e) a circuit for demodulating said information using said convolution signal;

wherein the surface acoustic wave convolver is constituted of:

a piezoelectric substrate;

a first input transducer formed on said substrate for generating surface acoustic wave corresponding to the signal received by said reception circuit;

a second input transducer formed on said substrate for generating a surface acoustic wave corresponding to said reference signal;

a plurality of waveguides provided side by side on a region of the substrate where the surface acoustic waves radiated from the first and second input transducers overlap, wherein a convolution signal of input signals is produced due to parametric mixing effect of the surface acoustic waves in respective waveguides, these waveguides generating a surface acoustic wave corresponding to said convolution signal; and an output transducer for receiving the surface acoustic wave radiated from the waveguides and taking out an electrical signal by conversion of the convolution signal, wherein the width of the surface acoustic wave radiated from the waveguides is narrower immediately before reception by the output transducer than immediately after radiation from the waveguides.

25. A communication system according to claim 24, further comprising means for reducing the width of surface acoustic wave radiated from the waveguides provided in a propagation path for the surface acoustic wave leading from said waveguides to the output transducer.

26. A communication system according to claim 25, wherein said reducing means consists of a hone-type waveguide.

27. A communication system according to claim 25, wherein said reducing means consists of a multistrip coupler.

28. A communication system according to claim 24, wherein said plurality of waveguides are formed in circular arc shape substantially concentric by which surface acoustic waves radiated from said waveguides are converged.

29. A communication system according to claim 28, wherein each of said waveguides consists of a plurality of consecutive linear portions.

30. A communication system according to claim 24, further comprising a detection circuit to which a convolution signal taken out from said output transducer is input and from which a detected signal is output to a demodulation circuit.

31. A communication system according to claim 30, further comprising a synchronizing circuit responsive to the convolution signal for producing a synchronizing signal and outputting the synchronizing signal to a reference signal generating circuit.

32. A communication system according to claim 24, wherein a signal transmitted from said transmitter is a spread spectrum signal, and further a synchronizing circuit for producing a synchronizing signal from the convolution signal, and an inverse spread circuit for removing the spread spectrum from the received signal and the synchronizing signal and for outputting the spread spectrum removed received signal to the demodulating circuit.

* * * * *

UNITED STATES PATENT AND TRADEMARK OFFICE

CERTIFICATE OF CORRECTION

PATENT NO. : 5,164,628

DATED : November 17, 1992

INVENTOR(S) : KOICHI EGARA ET AL.

It is certified that error appears in the above-identified patent and that said Letters Patent is hereby corrected as shown below:

Title page, and col. 1, line 2,
AT [54] TITLE

"CONVOLVA" should read --CONVOLVER--.

Title page,
AT [56] REFERENCES CITED

Other Publications,
Under Planat et al., "Soncis" should read --Sonics--.
Under Roy, "Sobn-cis" should read --Sonics--.

Title page,
AT [57] ABSTRACT

Line 1, "convolve" should read --convolver--.

Drawings:
SHEET 8 OF 12

FIG. 9, "CONVOLVA" should read --CONVOLVER--.

SHEET 10 OF 12

FIG. 11, "CONVOLVA" should read --CONVOLVER--.

SHEET 11 OF 12

FIG. 12, "CONVOLVA" should read --CONVOLVER--.

SHEET 12 OF 12

FIG. 13, "CONVOLVA" should read --CONVOLVER--.

UNITED STATES PATENT AND TRADEMARK OFFICE
CERTIFICATE OF CORRECTION

PATENT NO. : 5,164,628
DATED : November 17, 1992
INVENTOR(S) : KOICHI EGARA ET AL.

It is certified that error appears in the above-identified patent and that said Letters Patent is hereby corrected as shown below:

COLUMN 1

Line 2, "CONVOLVA" should read --CONVOLVER--.
Line 14, "elastic surface wave convolva" should read --surface acoustic wave convolver--.
Line 20, "elastic surface wave convolva." should read --surface acoustic wave convolver.--.
Line 57, "society journal"" should read --Society Journal"-- and "j69-C" should read --J69-C--.

COLUMN 2

Line 4, "elastic surface was convolva," should read --surface acoustic wave convolver,--.
Line 15, "elastic surface wave convolva" should read --surface acoustic wave convolver--.
Line 27, "elastic surface wave" should read --surface acoustic wave convolver--.
Line 28, "waveguide convolva" should read --waveguide convolver--.
Line 63, "an" should be deleted.

UNITED STATES PATENT AND TRADEMARK OFFICE

CERTIFICATE OF CORRECTION

PATENT NO. : 5,164,628

DATED : November 17, 1992

INVENTOR(S) : KOICHI EGARA ET AL.

It is certified that error appears in the above-identified patent and that said Letters Patent is hereby corrected as shown below:

COLUMN 3

Line 19, "elastic surface wave" should read --surface acoustic wave--.
Line 34, "an" should read --a-- and "outputting" should read --for outputting--.
Line 44, "an" should read --a--.
Line 47, "an" should read --a--.
Line 54, "those" should read --these--.
Line 55, "an" should read --a--.
Line 57, "elastic surface" should read --surface acoustic--.

COLUMN 4

Line 5, "an" should read --a--.
Line 16, "an" should read --a--.
Line 35, "surface wave engineering"" should read --Surface Wave Engineering"--.
Line 36, "communications society" should read --Communications Society--.
Line 54, "MANAS K. ROY" should read --Manas K. Roy--.
Line 62, "elastic surface convolva" should read --surface acoustic wave convolver--.

COLUMN 5

Line 37, "elastic surface wave convolva" should read --elastic surface acoustic wave convolver--.
Line 52, "note" should read --noted--.
Line 58, "elastic surface wave convolva" should read --elastic surface acoustic wave convolver--.
Line 64, "of for" should read --of, for--.

UNITED STATES PATENT AND TRADEMARK OFFICE
CERTIFICATE OF CORRECTION

PATENT NO. : 5,164,628

DATED : November 17, 1992

INVENTOR(S) : KOICHI EGARA ET AL.

It is certified that error appears in the above-identified patent and that said Letters Patent is hereby corrected as shown below:

COLUMN 6

Line 38, "elastic surface wave convolva" should read --elastic surface wave convolver--.
Line 57, "elastic surface wave convolva" should read --elastic surface wave convolver--.

COLUMN 7

Line 24, should read --the wave guides 44-1 to 44-n--.
Line 43, "elastic surface wave convolva" should read --elastic surface wave convolver--.
Line 68, "elastic surface wave convolva" should read --elastic surface wave convolver--.

COLUMN 8

Line 7, "elastic surface wave convolva" should read --elastic surface wave convolver--.
Line 9, "elastic surface wave convolva" should read --elastic surface wave convolver--.
Line 11, "convolva," should read --convolver,--.
Line 15, "elastic surface wave convolva" should read --elastic surface wave convolver--.
Line 17, "convolva" should read --convolver--.
Line 24, "elastic surface wave convolva" should read --elastic surface wave convolver--.
Line 48, "elastic surface wave convolva" should read --elastic surface wave convolver--.
Line 51, "elastic surface wave convolva" should read --elastic surface wave convolver--.

UNITED STATES PATENT AND TRADEMARK OFFICE
CERTIFICATE OF CORRECTION

PATENT NO. : 5,164,628

DATED : November 17, 1992

INVENTOR(S) : KOICHI EGARA ET AL.

It is certified that error appears in the above-identified patent and that said Letters Patent is hereby corrected as shown below:

COLUMN 9

Line 20, "elastic surface wave convolva" should read --elastic surface wave convolver--.
Line 30, "elastic surface wave convolva" should read --elastic surface wave convolver--.
Line 32, "elastic surface wave convolva" should read --elastic surface wave convolver--.
Line 53, "elastic surface wave convolva" should read --elastic surface wave convolver--.
Line 67, "an" should read --a--.

COLUMN 10

Line 3, "an" should read --a--.
Line 5, "output," should read --output--.
Line 7, "elastic surface wave convolva" should read --elastic surface wave convolver--.
Line 34, "an" should read --a--.

COLUMN 11

Line 68, "aid" should read --said--.

COLUMN 12

Line 44, "guide" should be deleted.

UNITED STATES PATENT AND TRADEMARK OFFICE

CERTIFICATE OF CORRECTION

PATENT NO. : 5,164,628

DATED : November 17, 1992

INVENTOR(S) : KOICHI EGARA ET AL.

It is certified that error appears in the above-identified patent and that said Letters Patent is hereby corrected as shown below:

COLUMN 13

Line 5, "surface" should read --a surface--.

Signed and Sealed this

Twenty-sixth Day of April, 1994

Attest:

BRUCE LEHMAN

Attesting Officer

Commissioner of Patents and Trademarks